(12) United States Patent
Nakatsuka et al.

(10) Patent No.: US 6,480,193 B2
(45) Date of Patent: Nov. 12, 2002

(54) METHOD AND SYSTEM FOR LONG-TERM ARCHIVING CAD DATA

(76) Inventors: Hisayo Nakatsuka, 7-26-402, Mita 3-chome, Minato-ku, Tokyo (JP), 108-0073; Toru Kato, 8-16, Kamisato 2-chome, Okazaki-shi, Aichi (JP), 444-2136; Ikuya Takimoto, 8-1, Sekinoue 2-chome, Seki-shi, Gifu (JP), 501-3211

( * ) Notice: Subject to any disclaimer, the term of this patent is extended or adjusted under 35 U.S.C. 154(b) by 78 days.

(21) Appl. No.: 09/837,977

(22) Filed: Apr. 19, 2001

(65) Prior Publication Data

US 2002/0023100 A1 Feb. 21, 2002

(30) Foreign Application Priority Data

Apr. 21, 2000 (JP) .................................. 2000-120982

(51) Int. Cl.$^7$ .............................................. G06T 17/00
(52) U.S. Cl. ....................................... 345/419; 345/420
(58) Field of Search ................................. 345/418, 419, 345/420, 621, 619; 716/5, 7, 12

(56) References Cited

U.S. PATENT DOCUMENTS

| | | | | |
|---|---|---|---|---|
| 5,402,351 A | * | 3/1995 | Batchelder et al. | ......... 264/401 |
| 5,842,213 A | * | 11/1998 | Odom et al. | ................. 707/100 |
| 5,871,805 A | * | 2/1999 | Lemelson | ..................... 427/10 |
| 5,990,897 A | * | 11/1999 | Hanratty | ..................... 345/420 |

* cited by examiner

*Primary Examiner*—Cliff N. Vo
(74) *Attorney, Agent, or Firm*—Huntley & Associates

(57) ABSTRACT

A method for storing CAD data over a long term which includes the step of storing over a long term a rule which is a modification of a standard rule which can convert various types of CAD data created by various types of CAD programs to text-based standard data, the rule being determined such that among items contained in the various types of CAD data, items relating to contents to be archived over a long term are selected, and data obtained through conversion of the selected items are treated as long-term archived data, and the rule containing at least a procedure for designing a converter which converts the selected data items to long-term archived data, and a procedure for designing a viewer which enables display units of various computer systems to display the converted long-term archived data; the step of creating a converter on the basis of the rule, the converter operating on a selected computer system in order to convert selected CAD data to long-term archived data; and the step of converting selected CAD data to long-term archived data by use of the converter and archiving the long-term archived data over a long term.

14 Claims, 2 Drawing Sheets

METHOD AND SYSTEM FOR LONG-TERM ARCHIVING CAD DATA

BACKGROUND OF THE INVENTION

1. Field of the Invention

The present invention relates to a method and system for reliably and easily archiving CAD data over a long term.

2. Description of the Related Art

Conventionally, even when CAD data which has been created as product data by use of a CAD system are present, it has been a general practice to output such CAD data in the form of drawings in order to manufacture a product and to provide support over the service life of the product. Further, as a measure against potential product liability and patent related lawsuits, the drawings have been archived as originals of the product data.

Meanwhile, recent progress in CAD systems enables the manufacturing of products through direct use of CAD data, and in some cases, such conversion of CAD data to drawings is performed only for the purpose of archiving, separately from development and production of the product. If a method of reliably reproducing CAD data is established in the future, it will become possible to store CAD data as originals of product data.

However, long-term archiving of CAD data involves a problem in that the structure and/or contents of CAD data basically depends on the CAD program that created the CAD data. CAD programs are restricted in terms of operation environment (hardware, OS, etc.), and CAD programs themselves are frequently upgraded. Further, in some cases, compatibility with old programs is not guaranteed and required operation environments are changed. Therefore, there is no guarantee that stored CAD data can be reliably reproduced in the future.

Accordingly, when CAD data is stored over a long term, in addition to CAD data to be stored, a system on which a corresponding CAD program can operate; i.e., a CAD program, hardware, OS, etc., must be stored. However, this is not practical when the life cycle of a product is as long as 20 to 40 years.

Further, another possibility is that when a CAD program, hardware, OS, or the like is drastically changed, CAD data are converted into data which match the new CAD program, hardware, OS, or the like. However, in this case, data conversion must be performed every few years, and the reliability of the conversion must be confirmed each time. This is a major problem in terms of the amount of labor required.

Further, in such a case, at appropriate intervals determined on the basis of life of hardware, the CAD program must be checked and modified or upgraded in order to ensure that the CAD program properly operates on the hardware at the time such checking is done. However, prerequisite to this, a company which can create and maintain such a CAD program needs to exist. When past instances are considered, it is found that this solution is not realistic when the life cycle of a product is as long as 20 to 40 years.

SUMMARY OF THE INVENTION

In view of the foregoing, one objective of the present invention is to provide a method and system for archiving of CAD data over a long term in a stable, reliable, and easy manner.

The present invention provides a method for archiving CAD data for long-term use, the method comprise the following steps: storing over a long term a rule which is a modification of a standard rule which can convert various types of CAD data created by a various types of CAD programs to text-based standard data, the rule being determined such that among items contained in the various types of CAD data, predetermined items relating to the contents to be archived over a long term are selected, and data obtained through conversion of the selected items is treated as long-term archived data, and the rule containing at least one procedure for designing a converter which converts the selected data items to the long-term archived data, and a procedure for designing a viewer which enables display units of various computer systems to display the converted long-term archived data; creating a converter on the basis of the rule, the converter operating on a selected computer system in order to convert selected CAD data to long-term archived data; and converting selected CAD data to long-term archived data by use of the converter and archiving the long-term archived data over a long term.

The method may further comprise the steps of: creating a viewer on the basis of the rule, the viewer enabling a display unit of a selected computer system to display the converted long-term archived data which has undergone long term archiving; and displaying the long-term archived data on the display unit of the selected computer system by use of the viewer.

The method may further comprise the step of: performing verification through comparison between the CAD data and the long-term archived data converted from the CAD data to thereby confirm the fidelity of the long-term archived data.

The rule may contain a procedure for designing a verification program for performing verification through comparison between the CAD data and the long-term archived data converted from the CAD data, as well as a procedure for performing verification.

The selected items may include items regarding shape, dimensions, notes, and tolerances.

The standard rule may be that specified under ISO 10303.

The present invention further provides a long-term archiving system for archiving over a long term various types of CAD data created by various types of CAD programs, the system comprising: a rule which is a modification of a standard rule which can convert various types of CAD data created by various types of CAD programs to text-based standard data, the rule being determined such that among items contained in the various types of CAD data, items relating to contents to be archived over a long term are selected, and data obtained through conversion of the selected items are treated as long-term archived data, and the rule containing at least one procedure for designing a converter which converts the selected data items to the long-term archived data, and a procedure for designing a viewer which enables display units of various computer systems to display the converted long-term archived data; long-term archived data acceptance means for accepting, as registration data, long-term archived data which has been converted from selected CAD data by use of a converter created on the basis of the rule and which has been confirmed to be the same as the original; long-term archiving means for storing over a long term the long-term archived data, which have been stored as registration data, together with registration information; and long-term archived data output means which, in response to a request, outputs the registration data stored in the long-term archiving means while authenticating that the output registration data are original.

The rule may contain a procedure for designing a verification program for performing verification through comparison between the CAD data and the long-term archived data converted from the CAD data to thereby confirm the fidelity, as well as a procedure for performing verification.

The system may further comprise rule storage means for storing the rule over a long term and for enabling a user to utilize the rule when necessary.

The system may further comprise perusal acceptance means for enabling a user to peruse the long-term archived data over a network.

The perusal acceptance means may provide the converter, the viewer, and/or the verification program, in response to a request.

The long-term archived data acceptance means may accept registration of long-term archived data via a network.

The selected items may include items regarding shape, dimensions, notes, and tolerances.

The standard rule may be that specified under ISO 10303.

As described above, the present invention can establish a form of storage suitable for long-term archiving of CAD data and a process for creating long-term archived data, as well as a archiving system for long-term archived data.

Further, the present invention realizes a CAD-data long-term archiving system as a system for archiving long-term archived data over a long term.

DESCRIPTION OF THE PREFERRED EMBODIMENT

An embodiment of the present invention will be described; however, the present invention is not limited thereto.

Figure 1:
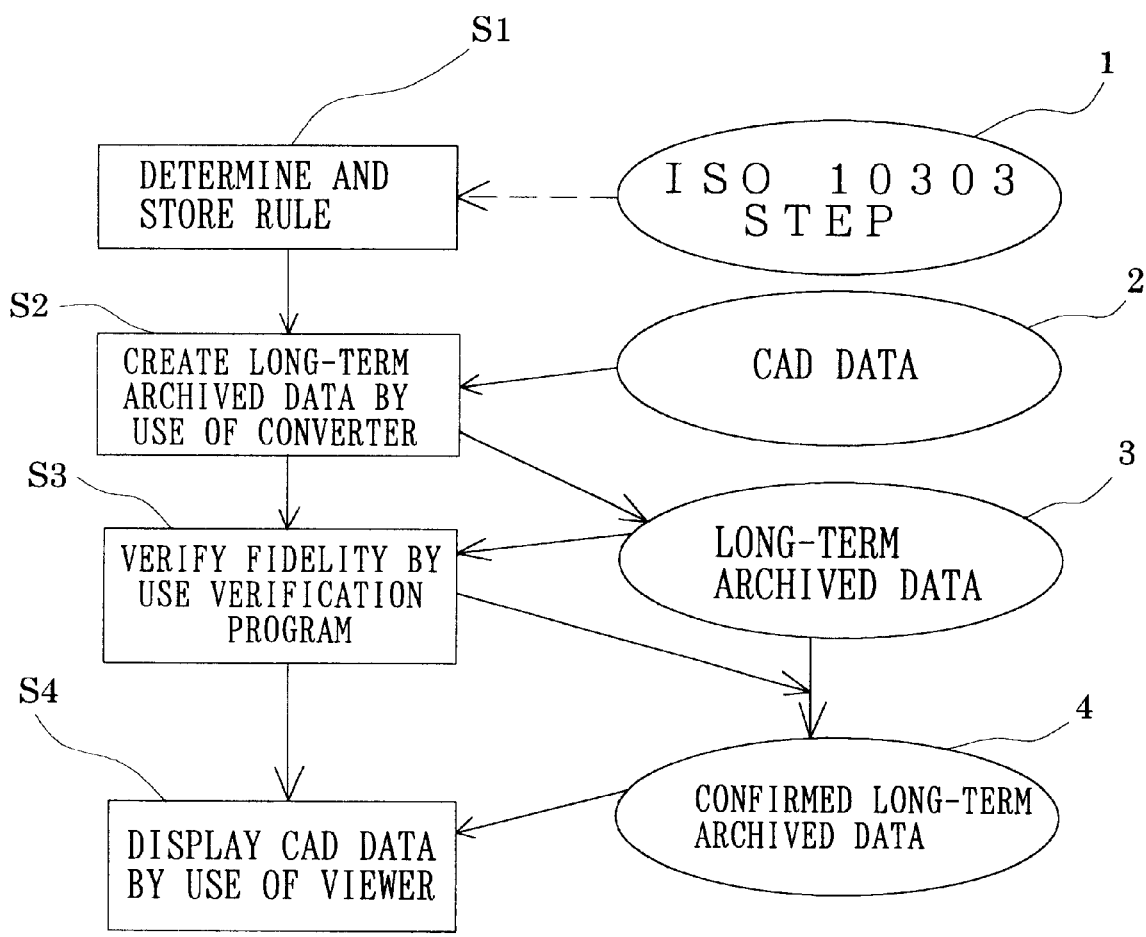
FIG. 1 is a diagram showing an example of a method of long-term archiving CAD data according to the present invention.

FIG. 1 is a diagram showing an example of a method of storing CAD data over a long term according to the embodiment. As shown in FIG. 1, in the method according to the present invention, in step S1, there is established and stored over a long term a rule. The rule is used to convert CAD data of various types to a long-term archiving form suitable for safely and reliably archiving the data over a long term. The rule is also used to display the long-term archived data and reliably reproduce.

The rule is a modification of a standard rule which can convert various types of CAD data created by various types of CAD programs to text-based standard data, and is determined such that among items contained in the various types of CAD data, items relating to contents to be long term archived are selected, and data obtained through conversion of the selected items are treated as long-term archived data.

The rule includes at least a procedure for designing a converter which converts the selected data items to long-term archived data; and a procedure for designing a viewer which enables display units of various computer systems to display the converted long-term archived data.

That is, the standard rule which can convert various types of CAD data to textbased standard data is modified in order to obtain the rule of the present invention which selects only items suitable for long-term archiving and eliminates ambiguity and unclearness involved in the conversion procedure, in order to make the conversion procedure clear, and which enables the long-term archived data to be reproduced and displayed with high reliability.

An example of the standard rule which can convert various types of CAD data to text-based standard data is specified in ISO 10303 (herein referred to as STEP) 1; however, the standard rule is not limited thereto. Examples of the items which the rule selects from a large number of items of CAD data include, but are not limited to, shape, dimensions, notes, and tolerances.

The present invention premises that such a rule is stored over a long term. Although no limitation is imposed on an entity who stores the rule and a location where the rule is stored, preferably, an organization such as a long-term archiving center, or a group which supervises such an organization, manages the rule. When such a rule is stored over a long term together with the long-term archived data, even when the CAD program, hardware, or OS used for creating the original CAD data has been changed, any of various types of computer systems can display the long-term archived data easily and reliably without use of any CAD program.

For example, when the standard rule is STEP 1, an engineer cannot design a converter and a viewer unless he or she reads a document of several thousands of pages. By contrast, when the rule of the present invention is used, the engineer can design a converter and a viewer relatively easily on the basis of information whose volume is about one-tenth that of the document of the standard rule.

In step S2, CAD data 2 of a certain type are converted to long-term archived data 3 by use of a converter which has been created on the basis of the rule. The converter used for conversion can be created relatively easily on the basis of the rule.

A user who performs design by use of a corresponding CAD program must compare the CAD data 2 and the long-term archived data 3 converted from the CAD data 2 for the purpose of verification to thereby confirm the fidelity of the long-term archived data; i.e., that the long-term archived data are identical to the original CAD data across the range of items subjected to conversion.

The confirmation is performed in step S3 in accordance with a standard procedure in which the CAD data and the long-term archived data converted from the CAD data are compared for verification by use of a verification program. The rule of the present invention includes a procedure for designing the verification program and a procedure for verification. Subsequently, the confirmed long-term archived data 4 are stored.

Although the rule preferably includes a procedure for designing the verification program and a procedure for verification in order to perform confirmation with a constant level of reliability, the method may be modified such that each user verifies the long-term archived data by him/herself without use of such a standard verification program.

In step S4, the long-term archived data archived over a long term are displayed, as needed, on a display unit of a computer system of one of various types, by use of a viewer. When the long-term archived data are three-dimensional, the shape of a product can be easily grasped. The viewer used for display can be created relatively easy on the basis of the rule.

Basically, the effect of the method of the present invention is attained insofar as the long-term archived data archived over a long term are displayed on the display unit of any of various types of computer systems. However, if necessary, the method may be modified such that the long-term archived data can be used as CAD data again if necessary.

Each user may hold the long-term archived data of the present invention. However, the present invention provides a CAD-data long-term archiving system suitable for archiving the long-term archived data over a long term. The CAD-data long-term archiving system stores the long-term archived data safely and reliably and prevents alteration or the like of archived data to thereby guarantee the fidelity of the data. That is, under the condition that registration is performed, the system accepts and stores long-term archived data and guarantees the identity of the archived data.

Figure 2:
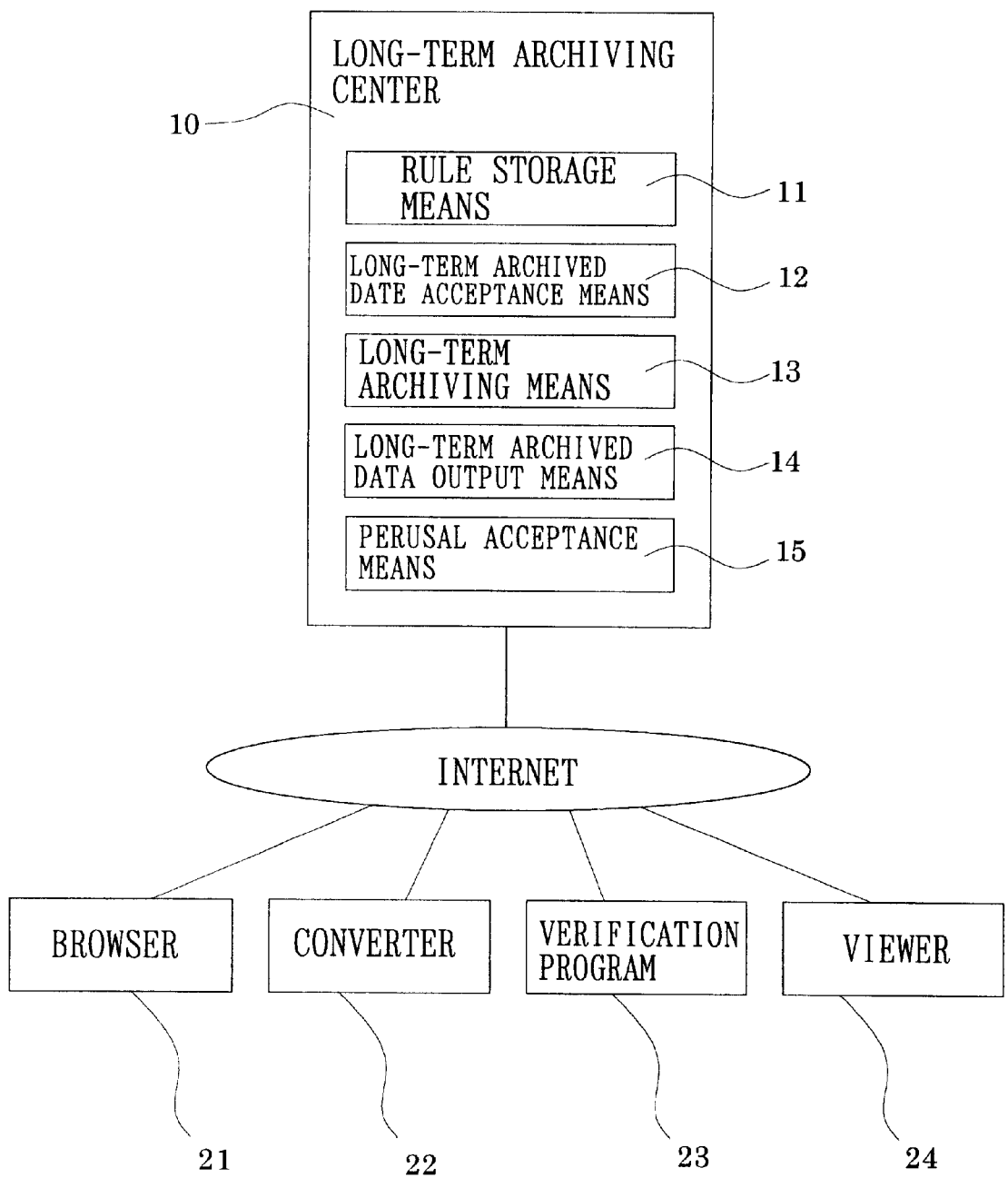
FIG. 2 is a diagram showing an example of a long-term archiving system according to the present invention.

FIG. 2 shows an example of the CAD-data long-term archiving system according to the present invention.

As shown in FIG. 2, a long-term archiving center 10 of the CAD-data long-term archiving system includes rule storage means 11 which stores the above-described rule in a reliable manner, and permits perusal of the rule through access via the Internet. The contents of the rule have been described above. It is preferred that the perusal can be performed by use of a browser 21 which operates on an ordinary computer. No limitation is imposed on the condition of permission of the perusal of the rule, and perusal may be permitted freely. It is to be noted that the rule is not necessarily required to be stored in the form of electronic information, and may be stored in the form of a book or the like which can be perused freely and distributed.

The long-term archiving center 10 includes long-term archived data acceptance means 12 for accepting long-term archived data as registration data. As described above, the long-term archived data are converted from selected CAD data by use of a converter created on the basis of the rule, and have been confirmed by a user through verification performed by use of a verification program. It is to be noted that the converter is created on the basis of the rule such that the converter can operate on a selected computer system, and the converter has the function of converting the selected CAD data to long-term archived data. Similarly, the verification program is created on the basis of the rule. The verification itself is not necessarily performed by use of a verification program, and a user may perform verification by him/herself.

The acceptance of registration data by the long-term archived data acceptance means 12 may be performed on-line via the Internet, or off-line. In either case, it is desirable to enable one-time registration of data.

When the registration is performed, the system requests the user to input predetermined registration information together with long-term archived data. Examples of the registration information include information showing a registrar, and contents of the data to be registered. However, information which shows that the restoration data have been confirmed is preferably registered together with the long-term archived data.

Long-term archiving means 13 archives the long-term archived data, which have been accepted by the long-term archived data acceptance means 12, together with confirmation data, date of confirmation, registration data, and data of registration. Although the long-term archiving means 13 is memory means of a large capacity which is highly reliable, the long-term archiving means 13 is not necessarily present within the long-term archiving center 10. Further, in order to prevent alteration or the like, the long-term archived data may be archived after being enciphered. In response to a request from long-term archived data output means 14 or perusal acceptance means 15, which will be described later, the long-term archiving means 13 enables the means to output or peruse the long-term archived data as needed. Needless to say, the long-term archiving means 13 archives the long-term archived data while perfectly maintaining their original form.

The long-term archiving center 10 includes the long-term archived data output means 14 which, in response to a request, outputs the long-term archived data archived in the long-term archiving means 13. The archived data output means 14 guarantees the identity of output data. That is, the archived data output means 14 guarantees that the output data is identical with the registered long-term archived data. Needless to say, no particular limitation is imposed on the guaranteeing method. This secures that the long-term archived data can be used in various applications. The archived data output means 14 may be designed such that it outputs the long-term archived data upon acceptance of an on-line request or such that it outputs the long-term archived data upon acceptance of an off-line request.

Further, the long-term archiving center 10 includes the perusal acceptance means 15. The perusal acceptance means 15 accepts a request for perusing the registered long-term archived data via the Internet. The perusal acceptance means 15 is preferably designed to enable perusal by use of the browser 21 which operates on an ordinary computer. Needless to say, the perusal is permitted when registration of the long-term archived data has been accepted under the condition that perusal is permitted. In the case in which the registration of the long-term archived data have been accepted under the condition that perusal is prohibited, no request for perusing the long-term archived data is accepted. Further, the perusal acceptance means 15 may be modified to make a judgment for each data item as to whether or not perusal is permitted; and to allow a user to peruse only data items for which perusal is permitted. Moreover, the perusal acceptance means 15 is preferably designed such that, during perusal operation, a user can search desired long-term archived data on the basis of predetermined registered information.

The perusal acceptance means 15 may be designed to provide the above-described converter, verification program, and viewer, which operate on a predetermined computer system.

In this case, two methods may be used for provision of the converter, verification program, and viewer. In the first method, each user is permitted to download the respective software programs. Thus, on a predetermined computer, the user can operate the converter 22 in order to convert CAD data into long-term archived data; operate the verification program 23 in order to compare the CAD data and the long-term archived data for verification; and operate the viewer 24 in order to display the long-term archived data on a predetermined display unit.

In another method, the system provides services per se which utilize the converter and other programs. That is, each user can receive services which are equivalent to those which the user can receive by use of the software programs obtained through downloading. For example, in the case of a converter, when a user transmits CAD data, the CAD data are converted to long-term archived data, which are then output.

In the above-described long-term archiving center 10, acceptance of long-term archived data, output of the long-term archived data, acceptance of perusal, etc., are performed via the Internet. However, the present invention is not limited thereto, and these operations may be performed via other various types of networks such as an Internet or an industrial extranet. Further, needless to say, the operations may be performed without use of a network. In this case, long-term archived data are preferably accepted and received at one time by use of a storage medium of large capacity.

What is claimed is:

1. A method for storing CAD data over a long term, the method comprising the steps of:

storing over a long term a rule which is a modification of a standard rule which can convert various types of CAD data created by a various types of CAD programs to text-based standard data, the rule being determined such that among items contained in the various types of CAD data, predetermined items relating to contents to be archived over a long term are selected, and data obtained through conversion of the selected items is treated as long-term archived data, and the rule containing at least a procedure for designing a converter which converts the selected data items to long-term archived data, and a procedure for designing a viewer which enables display units of various computer systems to display the converted long-term archived data;

creating a converter on the basis of the rule, the converter operating on a selected computer system in order to convert selected CAD data to long-term archived data; and converting selected CAD data to long-term archived data by use of the converter and archiving the long-term archived data over a long term.

2. A method according to claim 1, further comprising the steps of:

creating a viewer on the basis of the rule, the viewer enabling the display unit of a selected computer system to display the converted long-term archived data which has been undergone long-term archiving; and displaying the long-term archived data on the display unit of the selected computer system by use of the viewer.

3. A method according to claim 1, further comprising the steps of:

performing verification through comparison between the CAD data and the long-term archived data converted from the CAD data to thereby confirm the fidelity of the long-term archived data.

4. A method according to claim 3, wherein the rule contains a procedure for designing a verification program for performing verification through comparison between the CAD data and the long-term archived data converted from the CAD data, as well as a procedure for performing verification.

5. A method according to claim 1, wherein the selected items include items regarding shape, dimensions, notes, and tolerances.

6. A method according to claim 1, wherein the standard rule is that specified under ISO 10303.

7. A long-term archiving system for archiving over a long term various types of CAD data created by various types of CAD programs, the system comprising:

a rule which is a modification of a standard rule which can convert various types of CAD data created by various types of CAD programs to text-based standard data, the rule being determined such that among items contained in the various types of CAD data, items relating to contents to be archived over a long term are selected, and data obtained through conversion of the selected items are treated as long-term archived data, and the rule containing at least a procedure for designing a converter which converts the selected data items to long-term archived data, and a procedure for designing a viewer which enables display units of various computer systems to display the converted long-term archived data;

long-term archived data acceptance means for accepting, as registration data, long-term archived data which has been converted from selected CAD data by use of a converter created on the basis of the rule and which has been confirmed to be the same as the original;

long-term archiving means for storing over a long term the long-term archived data, which has been stored as registration data, together with registration information; and long-term archived data output means for outputting, in response to a request, the registration data archived in the long-term archiving means while guaranteeing the identity of the output registration data.

8. A long-term archiving system according to claim 7, wherein the rule contains a procedure for designing a verification program for performing verification through comparison between the CAD data and the long-term archived data converted from the CAD data to thereby confirm its fidelity, as well as a procedure for performing verification.

9. A long-term archiving system according to claim 7, further comprising rule storage means for storing the rule over a long term and for enabling a user to utilize the rule when necessary.

10. A long-term archiving system according to claim 7, further comprising perusal acceptance means for enabling a user to peruse the long-term archived data over a network.

11. A long-term archiving system according to claim 10, wherein the perusal acceptance means provides the converter, the viewer, and/or the verification program, in response to a request.

12. A long-term archiving system according to claim 7, wherein the long-term archived data acceptance means accepts registration of long-term archived data via a network.

13. A long-term archiving system according to claim 7, wherein the selected items include items regarding shape, dimensions, notes, and tolerances.

14. A long-term archiving system according to claim 7, wherein the standard rule is that specified under ISO 10303.

* * * * *